(12) United States Patent
Kopp et al.

(10) Patent No.: US 6,288,329 B1
(45) Date of Patent: Sep. 11, 2001

(54) FOLDING COMPONENT HOUSING

(75) Inventors: Siegfried Helmut Kopp, Renningen; Jürgen Günther Häberle, Böblingen; Tim Klaus Georg Schwegler, Sindelfingen, all of (DE)

(73) Assignee: DMT GmbH, Feinwerktechnische Komplettlosungen, Boblingen (DE)

( * ) Notice: Subject to any disclaimer, the term of this patent is extended or adjusted under 35 U.S.C. 154(b) by 0 days.

(21) Appl. No.: 09/112,541

(22) Filed: Jul. 9, 1998

(30) Foreign Application Priority Data

Aug. 20, 1997 (DE) ............................................. 197 36 026

(51) Int. Cl.[7] ...................................................... H05K 9/00
(52) U.S. Cl. ........................ 174/35 R; 361/683; 361/816; 361/725; 361/752; 361/800
(58) Field of Search ....................... 220/6, 666, DIG. 21; 206/271, 273, 275; 174/35 R, 35 MS; 361/816, 818, 752, 753, 799, 725, 800, 623

(56) References Cited

U.S. PATENT DOCUMENTS

| | | | |
|---|---|---|---|
| 3,715,629 | 2/1973 | Swengel, Sr. | 361/773 |
| 3,845,435 | 10/1974 | Georgopulos | 174/52.2 |
| 4,084,214 | 4/1978 | Eppich | 16/267 |
| 4,296,454 | 10/1981 | Wong | 174/52.1 |

(List continued on next page.)

FOREIGN PATENT DOCUMENTS

| | | |
|---|---|---|
| 1 109 908 | 9/1981 | (CA) . |
| 1 963 469 | 12/1969 | (DE) . |

(List continued on next page.)

OTHER PUBLICATIONS

Deutsches Patentamt, Mëchen, den Juli 31, 1997, 3 pages.
Cole, R., "Fast fabrication with foam chassis,"*Machine Design*, Mar. 9, 1995, 4 pages.
Grundig Technische Information, "Siecherheits–Bausteine, Sicher wie ein Safe," May 1979, 55–60 (translation provided).
Rekord–Verdächtig, "Ein komplettes server Gehäuse Monaten zur Serienreife entwiekeln," *ElektronikPraxis*, Jun. 20, 1997, 12, 112–114 (English translation included).
Yankee, H.W., "Manufacturing Processes," *Prentice–Hall*, 1979, 728.
Flexible FPC Folic als Schirm bietet neue Anwendugen, *Components*, 1996, 34, 1 (English translation of article only).
Mahn, J., et al., "HP–PAC: A New Chassis and Housing Concept for Electronic Equipment," *Hewlett–Packard J.*, Aug. 1994, 23–28.
Tuscarora Incorporated, "Innovative foam assembly chassis for electromechanical devices," *E–PAC*, 1 brochure page.
Smith, B., "Power Workstation at a Petium Price,"1994, 2 pages.
Deutsches Patentamt, Müchen, den 11. Nov. 1997, 4 pages.

*Primary Examiner*—Dean A. Reichard
*Assistant Examiner*—Hung V Ngo
(74) *Attorney, Agent, or Firm*—Woodcock Washburn Kurtz Mackiewicz & Norris LLP (57) ABSTRACT

A foldable blank includes a substrate and a conducting layer. The substrate is folded so as to form a component housing. When the substrate is folded to form a housing, the conducting layer provides electrical shielding to devices situated within the housing. The housing has holes situated therein to accommodate air flow and external connections to devices located within the housing. The housing may be employed to envelop a chassis manufactured from expanded polypropylene.

7 Claims, 8 Drawing Sheets

U.S. PATENT DOCUMENTS

| | | | |
|---|---|---|---|
| 4,310,870 | 1/1982 | Kia et al. .............................. | 361/726 |
| 4,527,285 | 7/1985 | Kekas et al. ........................ | 359/163 |
| 4,585,122 | 4/1986 | Stegenga ............................. | 220/260 |
| 4,667,270 | 5/1987 | Yagi ..................................... | 361/679 |
| 4,768,286 | 9/1988 | Ketcham .............................. | 29/841 |
| 4,864,469 | 9/1989 | Boudon ................................ | 361/736 |
| 4,901,205 * | 2/1990 | Landis et al. ........................ | 361/816 |
| 4,922,059 * | 5/1990 | Walker et al. ....................... | 174/254 |
| 4,926,291 | 5/1990 | Sarraf .................................. | 361/687 |
| 5,045,977 | 9/1991 | Cesar ................................... | 361/725 |
| 5,136,119 | 8/1992 | Leyland .......................... | 174/35 MS |
| 5,473,507 | 12/1995 | Schwegler et al. ................. | 361/679 |
| 5,581,047 | 12/1996 | Lazaroff .............................. | 206/271 |
| 5,644,472 | 7/1997 | Klein ................................... | 361/679 |

FOREIGN PATENT DOCUMENTS

| | | |
|---|---|---|
| 24 39 972 A1 | 3/1976 | (DE) . |
| 24 24 722 B2 | 4/1979 | (DE) . |
| 137 306 | 8/1979 | (DE) . |
| 34 47 791 A1 | 7/1986 | (DE) . |
| 33 13 616 C2 | 3/1987 | (DE) . |
| 33 25 360 C2 | 12/1987 | (DE) . |
| 34 47 801 C2 | 3/1989 | (DE) . |
| 89 11 405 U1 | 12/1989 | (DE) . |
| 39 33 647 A1 | 4/1991 | (DE) . |
| 39 22 188 C2 | 10/1992 | (DE) . |
| 92 07 735 U1 | 10/1992 | (DE) . |
| 92 17 174 U1 | 3/1993 | (DE) . |
| 42 06 727 A1 | 9/1993 | (DE) . |
| 93 04 431 U1 | 9/1993 | (DE) . |
| 91 16 755 U1 | 12/1993 | (DE) . |
| 295 05 578 U1 | 7/1995 | (DE) . |
| 295 09 557 U1 | 10/1995 | (DE) . |
| 44 47 466 A1 | 11/1995 | (DE) . |
| 196 20 881 | 11/1996 | (DE) . |
| 0 546 211 B1 | 7/1994 | (EP) . |
| 59 074082 | 4/1984 | (JP) . |

* cited by examiner

FOLDING COMPONENT HOUSING

BACKGROUND OF THE INVENTION

1. Field of the Invention

The present invention relates to a housing assembly for equipment components. In particular, the present invention provides a housing assembly created by folding a flat blank.

2. Description of the Prior Art

Generally, a chassis for holding equipment components is known. Depending upon the nature of the equipment, the components may be printed circuit boards, storage disks, ventilators, loudspeakers, cooling units, pumps, gear units, etc. The individual components are held in the chassis by mechanical fixtures whereby the components are arranged in a specific fixed position relative to other components. Such a chassis generally consists of a frame with a number of partitions in which the components are fitted. Typically, the frame itself is attached to an external housing of the device.

Metal chassis are often complicated and expensive to design and assemble. Bolts, screws, rivets, or other attachment means are needed to secure components to a metal chassis. Metal chassis are rigid and therefore require precision machining of the chassis as well as the components attached to the chassis.

The introduction of plastic components has further complicated chassis design. Plastic components require electrical shielding. For example, plastic components of an electrical device may need to be covered with conductive material. Alternatively metal plates or foil must be attached to the chassis. For these reasons, it has proven to be structurally and mechanically complicated, as well as expensive, to assemble a chassis having plastic components.

Plastic chassis have been developed to overcome some of the shortcomings of metal chassis and the difficulties presented by plastic components. Typically, plastic chassis are designed for a specific device, such as a computer or an electronic measuring instrument. The chassis is formed by a support unit made of plastic that is shaped to match the outer shapes of the components. The components are held in the chassis by positive locking without attachment elements such as screws and rivets and thereby overcome some of the shortcomings of metal chassis.

A plastic chassis may comprise a lower part and an upper part. Components are fitted into the lower part of the support unit and the upper part is placed over the lower part. The components fit snugly into the receptacle areas created by recesses in the lower and upper chassis areas. In some embodiments, the upper part and the lower part are hinged to each other along one edge so that the upper part can be swivelled upwards to permit access to the components fitted in the lower part. A plastic chassis can be configured so that recesses exist at different levels, with one level being located above the other. This allows for positioning components one above each other. Often, a plastic chassis has ventilation ducts that are molded into the plastic. A ventilator is located in one of the ventilation ducts in such a way that the flow of air produced by the ventilator is directed over components that need to be cooled.

U.S. patent application Ser. No. 08,936039 entitled "Component Housing for Integration with Furniture," assigned to the assignee of the present invention, provides a description, which is hereby incorporated by reference in its entirety, of a housing assembly that can be integrated into typical work spaces and furniture so as to provide for quick and easy access to equipment while maintaining an aesthetically appealing environment. The housing assembly disclosed therein comprises a housing and a chassis and can be integrally coupled to a standard piece of furniture, such as a desk. The housing may be in the form of a drawer which can be inserted and withdrawn from a standard unit of furniture such as a desk or cabinet. The drawer has perforations in its bottom and sides for air flow and is preferably made from a metal or metallic material but alternatively may be made from a non-metallic material which is lined with a metallic film. The chassis is made of plastic, preferably expanded polypropylene and may comprise two parts in which are secured equipment components. Projections extend from the sides of the chassis and extend to the drawer walls and thereby create air ducts through which air may flow to cool the components situated in the chassis. Plastic inserts may be placed in the air ducts created by the projections so as to direct the air flow within the assembly. Thus, according to such a housing assembly, computers, measuring instruments, laboratory equipment, multimedia equipment may be housed in the drawer of a desk or laboratory table.

Despite the advantages offered by the above described component housing devices, there being a need in the art for an improved housing. In particular, there is a need in the art for a housing which is simple to change or adapt to the environment. In addition, the housing should be light and require minimum space for transport and storage. Further, the housing should be easily manufactured. Finally, there is a need for a housing with the above mentioned characteristics which also satisfies all the requirements of the relevant electrical shielding standards and specifications, such as Cispr. 22.2. Class B, 30 MHZ–1 GHz.

It is therefore desirable to provide an improved housing which is easily manufactured and transported and which can be readily adapted to a new environment.

SUMMARY OF THE INVENTION

Accordingly, it is the general object of the current invention to provide a housing that is easily manufactured and transported and which can be readily adapted to a new environment.

Briefly, this object, as well as other objects of the current invention, is accomplished in a foldable blank for forming a device housing, comprising the following items: a bottom section; a top section; and a front section. The front section is attached on one side to the bottom section and attached on another side to the top section. The top section is foldable to form a top portion of a box while the bottom section is foldable to form a bottom portion of a box. The top portion hinges around the front section and over the bottom portion so as to form an enclosed box. In one embodiment, the top portion and the bottom portion are secured together using a fastener such as velcro strips, zippers, screws, or press fasteners.

In one embodiment of the invention, the top section comprises the following elements: a top section base panel; a first top section side panel; a second top section side panel; and a top section back panel. The first top section side panel, the second top section side panel, and the top section back panel are foldably connected to the top section base panel. The first and second top section side panels have internal side panels extending therefrom and the top section back panel has a first and second internal side panel foldably attached thereto.

The bottom section comprises the following elements: a bottom section base panel, a first bottom section side panel, a second bottom section side panel, and a bottom section back panel. The first bottom section side panel, second bottom section side panel, and bottom section back panel are foldably connected to the bottom section base panel.

The front panel or section foldably connects on one side with the top section base panel and foldably connects on a second side with the bottom section base panel. The front panel has an internal side panel extending from a third side and an internal side panel extending from a fourth side.

Generally, the foldable blank including the bottom section, top section, and front section is composed of a substrate having an electrically conductive layer situated thereon. The conductive layer substantially covers at least one surface of the substrate and forms an electrostatic shield when the blank being folded and the top portion of the box is closed over the bottom portion. The substrate may be corrugated board, laminate, composite material, paper board, fabric, leather, thermoplastic composite or fabric. The conductive layer may be metallic netting, metallic fabric, or metallic foil.

In a preferred embodiment, the front section has openings situated therein for transmission of air as well as openings for accessing components located substantially behind the front section. The openings may be covered by the electrically conductive layer so as to insure electrostatic protection for devices in the housing.

In a preferred embodiment, the top portion has a first conducting projection situated therein electrically connected to the conducting layer and the bottom portion has a second conducting projection situated therein electrically connected to the conducting layer. When the top portion is placed substantially over the bottom portion, contact is established between the first conducting projection and the second conducting projection so as to establish electrical conductivity between the conducting layer in the top portion and the conducting layer in the bottom portion. In one embodiment, the first conducting projection is attached to the top section internal side panels and the second conducting projection is attached to the bottom section side panels.

According to another aspect of the invention, there is disclosed a device comprising a chassis and a housing folded from a blank. In the preferred embodiment, the chassis is manufactured from expanded polypropylene.

According to still another aspect of the invention, there is disclosed a method of constructing a housing from a foldable blank. The method comprises the following steps: folding the internal side panels foldably connected to the top section back panel approximately ninety degrees relative to the top section back panel; folding the internal side panels foldably connected to the front panel approximately ninety degrees relative to the front panel; folding the top section back panel and the front panel approximately ninety degrees relative to the top section base panel; folding the first and second top section side panels approximately ninety degrees relative to the top section base; folding the top section internal side panels approximately ninety degrees relative to the top section side panels; folding the bottom section side panels approximately ninety degrees relative to the bottom section base panel; folding the bottom section back panel approximately ninety degrees relative to the bottom section base panel; and folding the base of the top section so as to become substantially parallel with the base of the bottom section.

Other aspects of the invention are described below.

BRIEF DESCRIPTION OF THE DRAWINGS

The objects and advantages of the invention are further apparent from the following detailed description of presently preferred exemplary embodiments of the invention taken in conjunction with the accompanying drawings, of which.

DETAILED DESCRIPTION OF PRESENTLY PREFERRED EMBODIMENTS

A housing assembly with the above-mentioned beneficial features in accordance with a presently preferred exemplary embodiment of the invention will be described below with reference to FIGS. 1–9. It will be appreciated by those of ordinary skill in the art that the description given herein with respect to those figures is for explanatory purposes only and is not intended in any way to limit the scope of the invention.

The inventive component housing comprises a foldable blank which can be folded so as to form a housing in which devices may be stored. In a preferred embodiment, the foldable blank comprises a substrate which has an electrical shielding situated therein. The substrate may be manufactured from paper board, corrugated board, laminate, fabric, leather, thermoplastic composite, thermoset plastic such as resin-glass fiber, or a material with similar properties. The electrical shielding layer consists of a material that has low-impedance surface conductivity properties. Such a material may be, for example, a metal foil, a metal fabric or a metal net, but may also be a thin metal layer that is applied directly to the folded housing.

Construction of the housing begins with the "blank". Typically, the blank is manufactured as a flat unit which is folded to produce a housing in which a chassis or component holder can be situated. The geometric shape of the housing is dictated by the chassis or component holder which is to be fitted within the housing. As described in further detail below, the blank is folded so that the appropriate electrical contacts are made between various conducting surfaces located in or on the blank and thereby provide electrical shielding for the devices located within the housing.

In a preferred embodiment, the present inventive housing may be used in cooperation with the foam chassis or component holders as described in co-pending U.S. patent application Ser. No. 08/736,039, which description is hereby incorporated by reference in its entirety. Employing the chassis of the U.S. patent application Ser. No. 08/736,039 application with the present inventive housing assures that stability and static shielding properties are achieved, while allowing sufficient cooling to be provided via ventilation ducts in the foam chassis. In such an embodiment, the housing may comprise a, material that conducts electricity and is also permeable to air. Such material may be a net, a metal fabric or a fabric incorporating metal threads or particles. When such a material is employed, openings in the chassis that are provided to ventilate and cool the device may be covered by the housing. The housing creates a Faraday cage around the device and provides protection against accidental electrical contacts. However, because the housing is composed of permeable material, it also allows for ventilation of the chassis.

Because the folded box housing may be made from paper board, laminate or a similar material, it is simple and inexpensive to replace the housing with a new or different housing. Indeed, changing the external design by changing the housing is straightforward. A device equipped with the present housing can be adapted to practically any environment without great difficulty and at low cost.

The number of parts that form the housing has been reduced to one and the weight of the housing has been considerably reduced. A housing in accordance with the invention can be stored and transported flat in the form of an unfolded blank. A chassis, components, and the housing can be assembled into a complete device either during production or alternatively may be assembled after transport to the dealer or end-user. No special tools or skills are required.

Production tolerances for the present housing are less demanding than those for housings manufactured from metal or rigid plastic which require that parts be manufactured with great precision. Components can be easily fitted into the housing during production and can be clamped in position securely without additional attachment materials.

The properties of the materials from which the preferred embodiments are manufactured provide additional protection during impact. As a result of the improved impact absorbent qualities of the housing, the impact protection requirements on the packaging used for the device during transport are lower. Packaging material and transport volume are also reduced considerably as a result.

Figure 1:
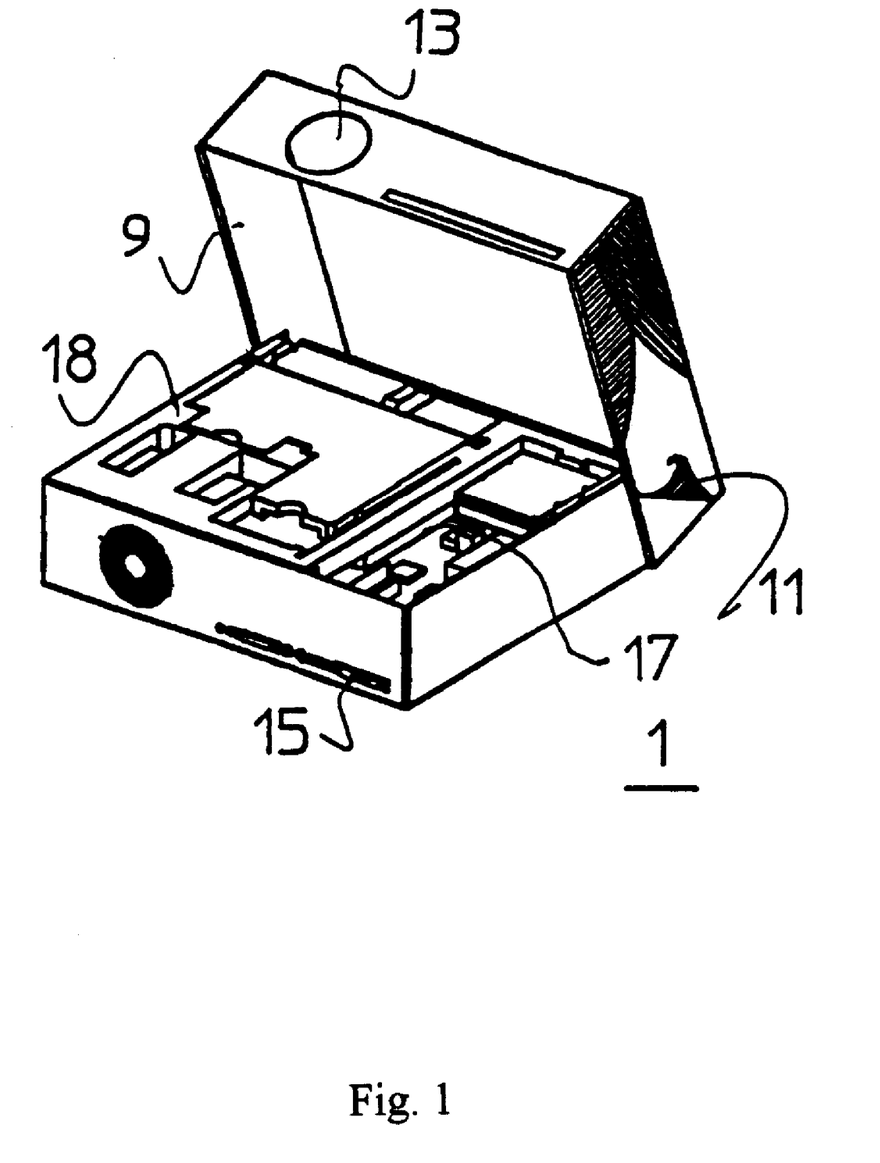
FIG. 1 provides a perspective view of the inventive housing with a chassis situated therein.

FIG. 1 provides a perspective view of the inventive housing with a chassis situated therein. As shown, a top chassis section 18 and a bottom chassis section 17 has been placed in inventive housing 1. Holes 13 allow cooling air to pass through housing 1 and into chassis portions 17 and 18. Openings 15 have been provided in housing 1 so as to accommodate plug connector strips. Film 11 with an aesthetically pleasing design has been applied to the exterior of housing 1. Low-impedance conducting layer 9 on the interior of housing 1 provides electrical shielding as described in greater detail below.

Figure 2:
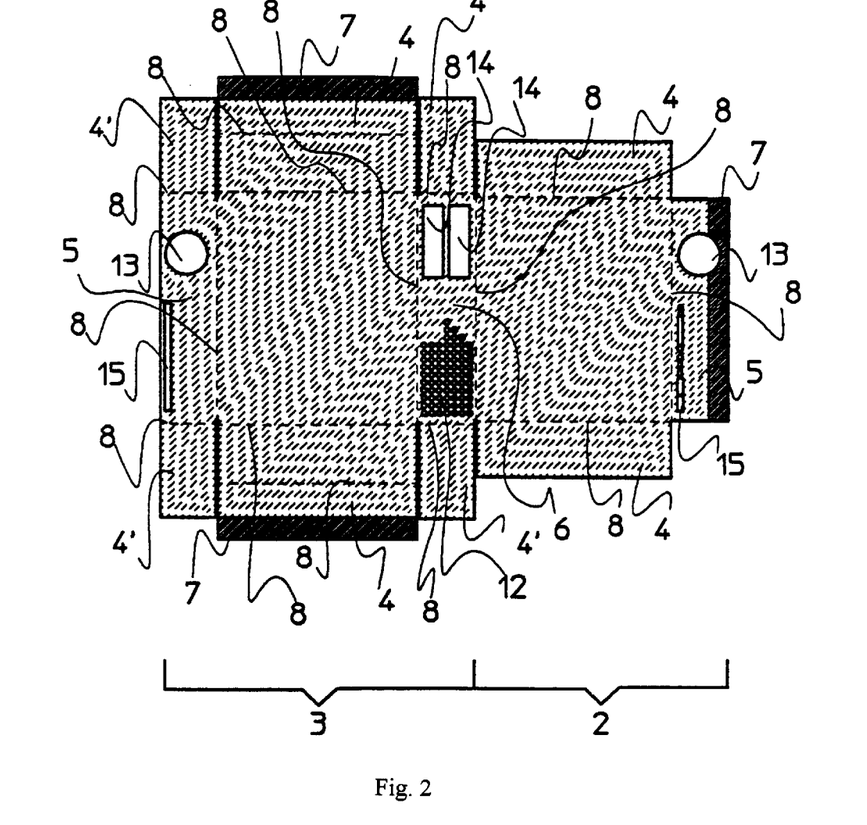
FIG. 2 provides a view of the inventive housing of FIG. 1 prior to being folded.

FIG. 2 provides a view of inventive housing 1 prior to being folded. In this condition, housing 1 exists as a flat blank. The flat blank has a portion corresponding to base or bottom section 2 and lid or top section 3. Base 2 and lid 3 are formed from side panels 4 and 4', back panels 5, front panel 6 and projection 7. Openings 12 allow air into housing 1 and openings 13 allow air out. Openings 14 accommodate media drives while openings 15 allow for a plug connector strip. Dashed lines or edges 8 on the blank indicate where folds should be made so as to form housing 1.

The sequence of folding operations are described below in detail with reference to FIGS. 9A–H. A design may be either printed onto the outside surface of housing 1 or produced by applying an appropriately designed film 11 as described below with reference to FIG. 5.

Figure 2A:
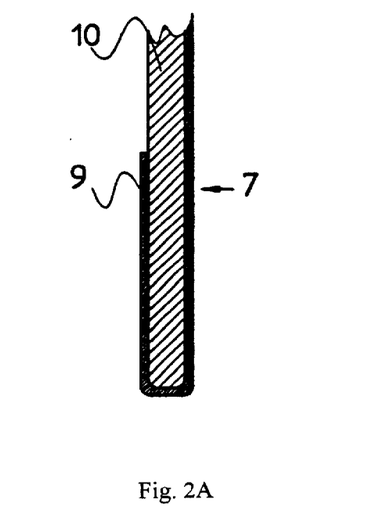
FIG. 2A provides an enlarged sectional view of the projection shown in FIG. 2.

FIG. 2A provides an enlarged sectional view of projection 7. Projection 7 comprises substrate 10 and low-impedance conducting layer 9. Low-impedance conducting layer 9 covers the internal surface of housing 1. As shown, layer 9 extends to both sides of projection 7. As is described below with reference to FIG. 6, placing conducting layer 9 on both sides of projection 7 insures that contact is made between metal surfaces when the blank is folded. By establishing contact between conducting layer 9 in top section 3 with conducting layer 9 in bottom section 2, a Faraday cage for electrostatic protection is created.

Figures 3, 4, 5:
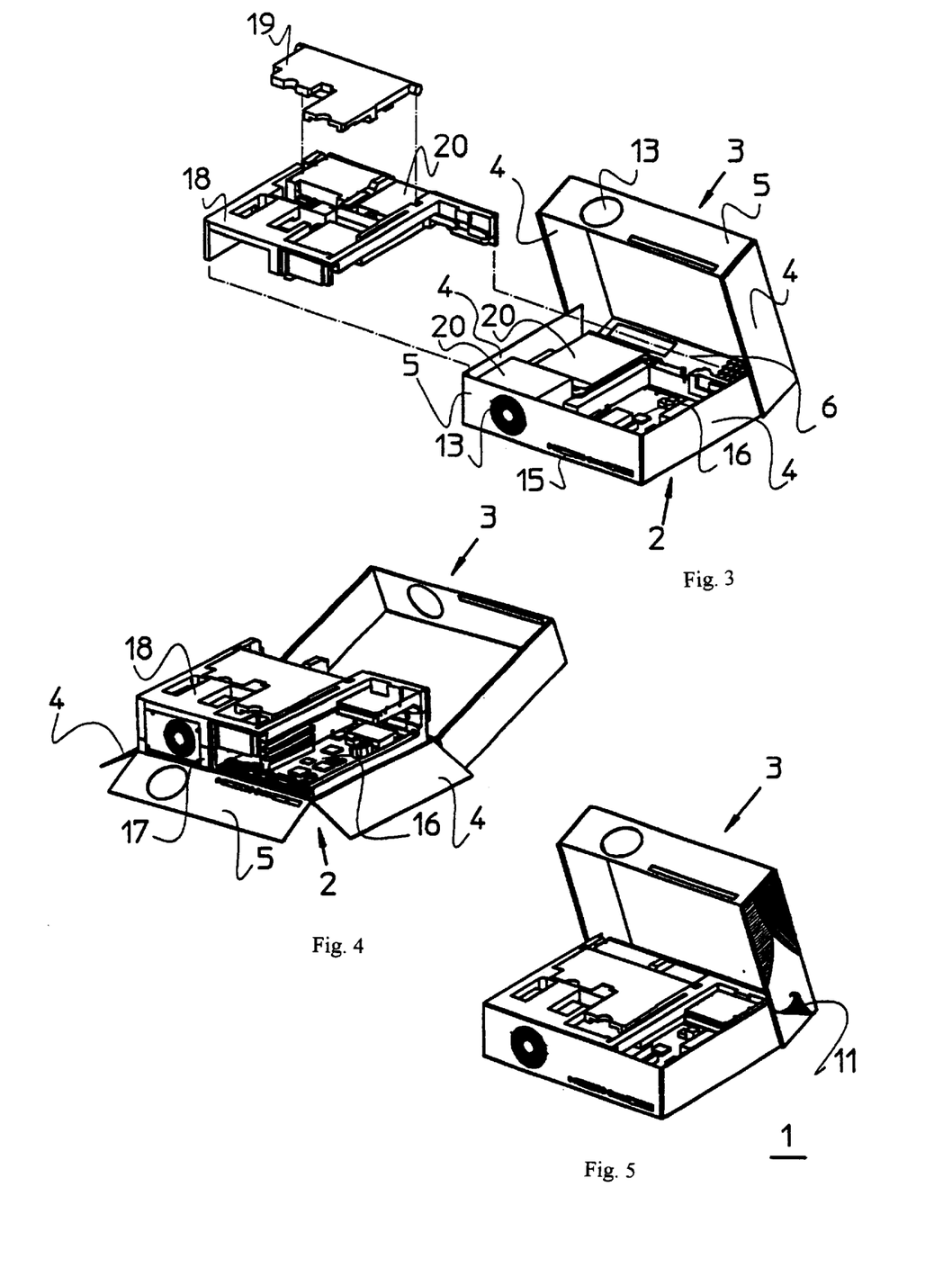
FIG. 3 provides an exploded view of a chassis and electrical components situated in a housing in accordance with the present invention.
FIG. 4 provides a view of an assembled chassis situated in a partially assembled inventive housing.
FIG. 5 provides a view of an assembled chassis situated in the housing of FIG. 1 with top section 3 in an opened position.

FIG. 3 provides an exploded view of a chassis and electrical components situated in a housing in accordance with the present invention. The housing consists of a bottom section or base 2 and a top section or lid 3, which have been erected from the blank shown in FIG. 2. Side panels 4, back panels 5, and front panel 6 have been folded perpendicular to the base portions of bottom section 2 and top section 3. Openings 13, 15, and 16 are plainly illustrated. Device components 20, such as drives, main supply units and ventilators are held in bottom chassis section 17 (not shown) which is situated within bottom section 2. Top chassis section 18 with retaining element 19 for large components 20 is positioned on top of bottom chassis section 17 to hold components 20 in position. Housing 1 can be closed by placing top section 3 over bottom section 2. In a preferred embodiment, housing 1 can be secured in a closed position—for example to be dust-tight—at its open edges with appropriate zip fasteners, velcro fasteners or press fasteners or by means of appropriately applied screws It should be noted that although fasteners may be used, they are not necessary to the invention.

FIG. 4 provides a view of an assembled chassis situated in a partially assembled inventive housing 1. Back panel 5 and side panels 4 of bottom section 2 are shown folded down, exposing chassis components 17 and 18 and printed circuit board 16. To erect a housing around chassis components 17 and 18, sides 4 and 5 merely need to be folded up and top section 3 placed over the fully assembled bottom section 2.

FIG. 5 provides a view of an assembled chassis situated in housing 1 with top section 3 in an opened position. This view illustrates that even when housing 1 is fully assembled, a chassis or other body located in housing 1 can be easily accessed. Such accessibility to items located in housing 1 greatly facilitates performance of maintenance tasks, quality inspection and testing.

Figure 6:
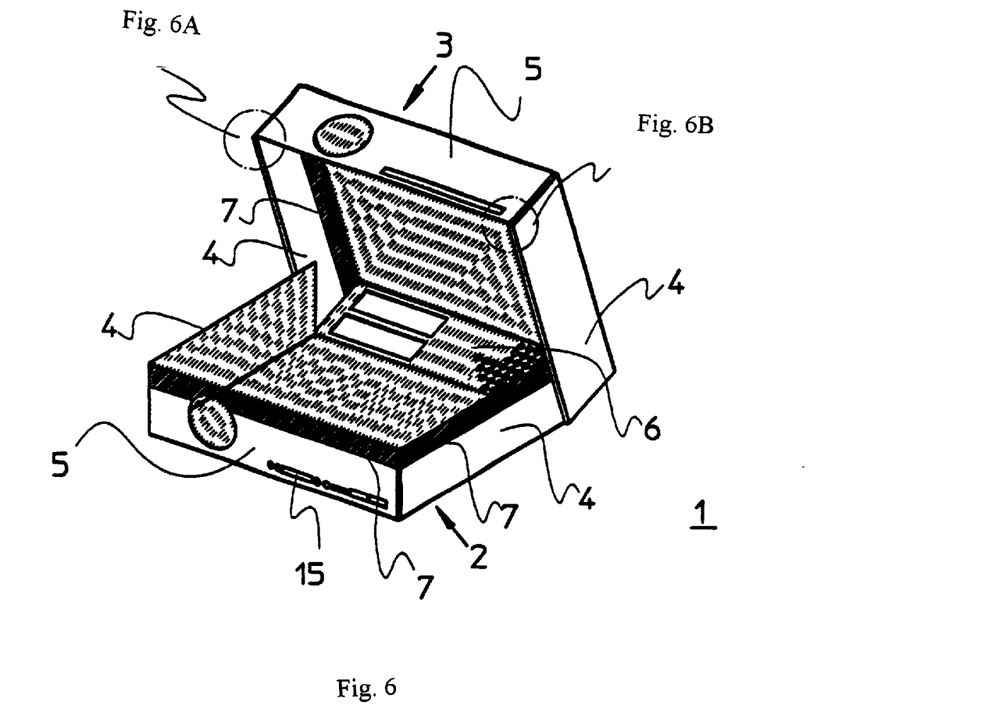
FIG. 6 provides a view of the assembled housing in accordance with the present invention without a chassis or other device situated therein.

FIG. 6 provides a view of the assembled housing without a chassis or other device situated therein. As shown, projections 7 extend along the top exterior portion of sides 4 and 5 of bottom half 2. Similarly, projections 7 are situated along the interior portion of top half 3. When top half 3 of housing 1 is placed over bottom half 2, projections 7 located on the exterior of side panels or walls 5 and 4 of bottom half 2 align and contact with projections 7 located on the interior of side panel 4' and low impedance layer 9 on back panel 5 of top section 3. In this way, contact is established between the low-impedance metal surfaces 9 of top 3 and bottom section 2 and thereby provides dependable electrostatic shielding for devices situated in housing 1. Side panels 4 and back panel 5 of bottom section 2, because they are folded inwards from their initial state and therefore attempt to return to their initial flattened state, apply constant pressure against the internal side panel 4' and back panel 5 of top section 3. The interference fit between the various walls or panels insures electrical contact between projections 7.

Figure 6A:
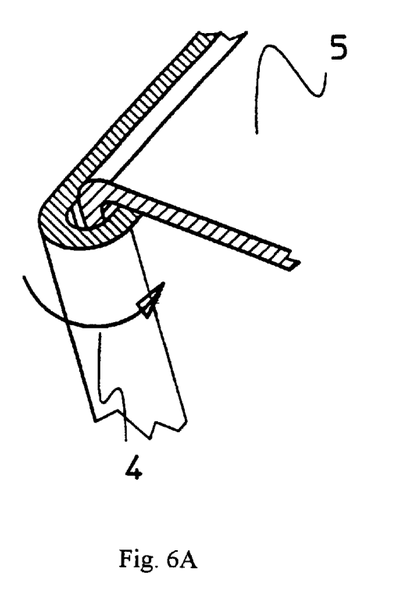
FIGS. 6A and 6B provide enlarged views of the corner sections of the top section of a housing in accordance with the present invention.
Figure 6B:
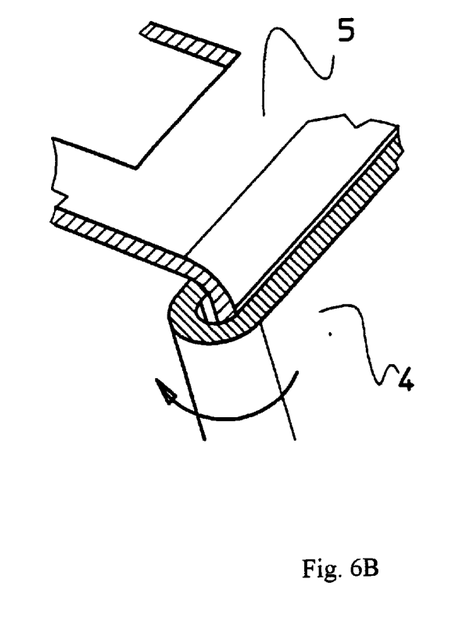

FIGS. 6A and 6B provide enlarged views of the corner sections of top section 3. As shown and described in further below, internal side panels 4' (not visible) of back panel 5 are folded to fit between internal side panel 4' and side panel 4 which have been folded against each other. This folding arrangement provides for the inventive housing to be completed and remain intact without the use of fastening means.

Figure 7:
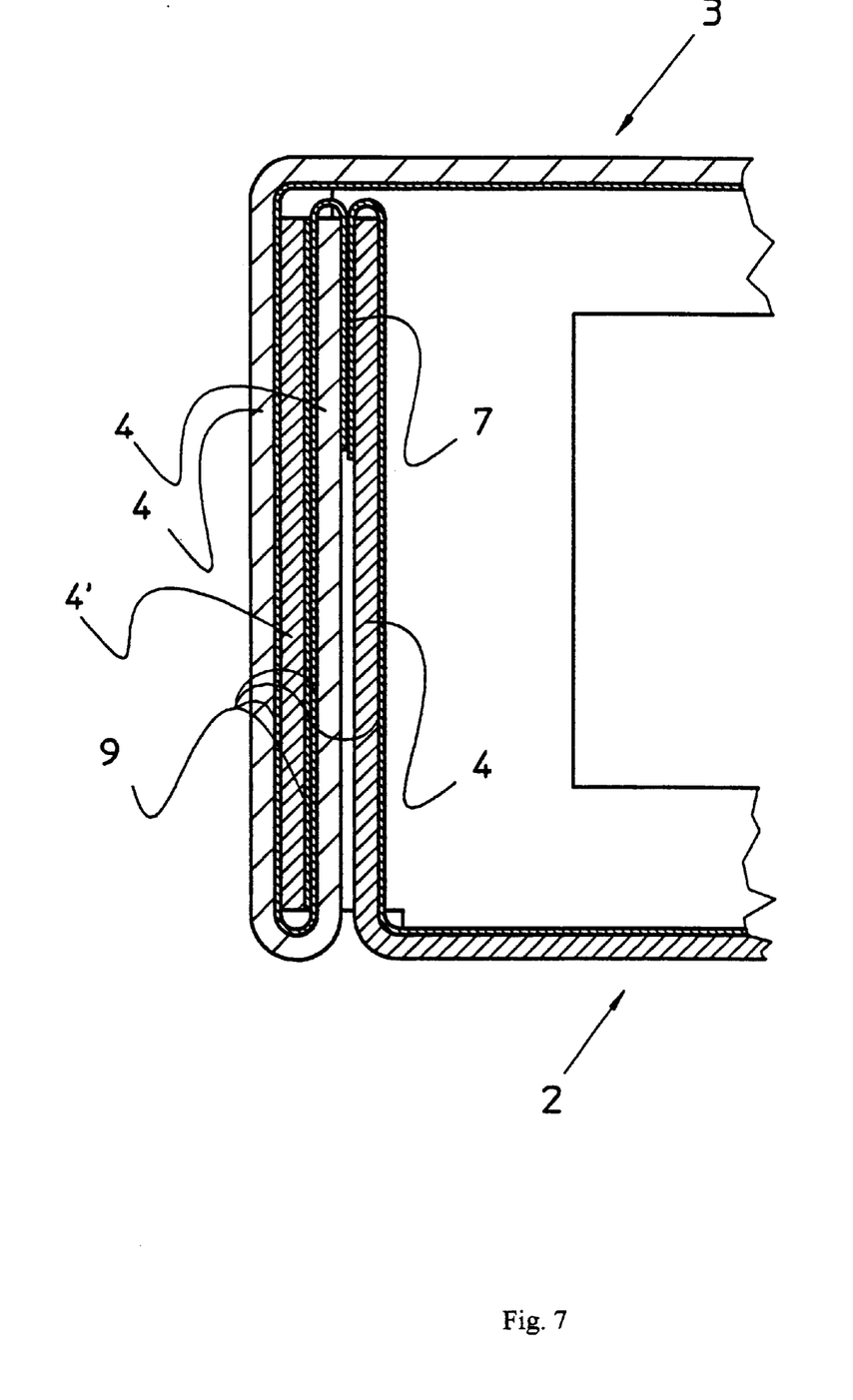
FIG. 7 provides a sectional view of a portion of the top section of the invention housing positioned over the bottom section of the inventive housing.

FIG. 7 provides a sectional View of the side panels 4 of top section 3 positioned over bottom section 2. As shown, when top section 3 is positioned over bottom section 2, contact is established between metallic layers 9 via metallic projections 7. Projections 7 located on internal side panels 4' of lid 3 and side panels 4 of bottom 2 establish an excellent electrical connection with each other. As has already been explained, this connection being enhanced as a result of the outward force generated by side panels 4 of bottom section 2 and internal side panel 4' of top section 3 which attempt to return to their initial unfolded state. Conducting layer 9 is positioned on the interior surface of both sections 2 and 3. When contact is made between projections 7 on bottom 2 and top 3, a continuous metallic layer is created throughout the housing which provides electrostatic protection for devices situated in housing 1.

Figure 8:
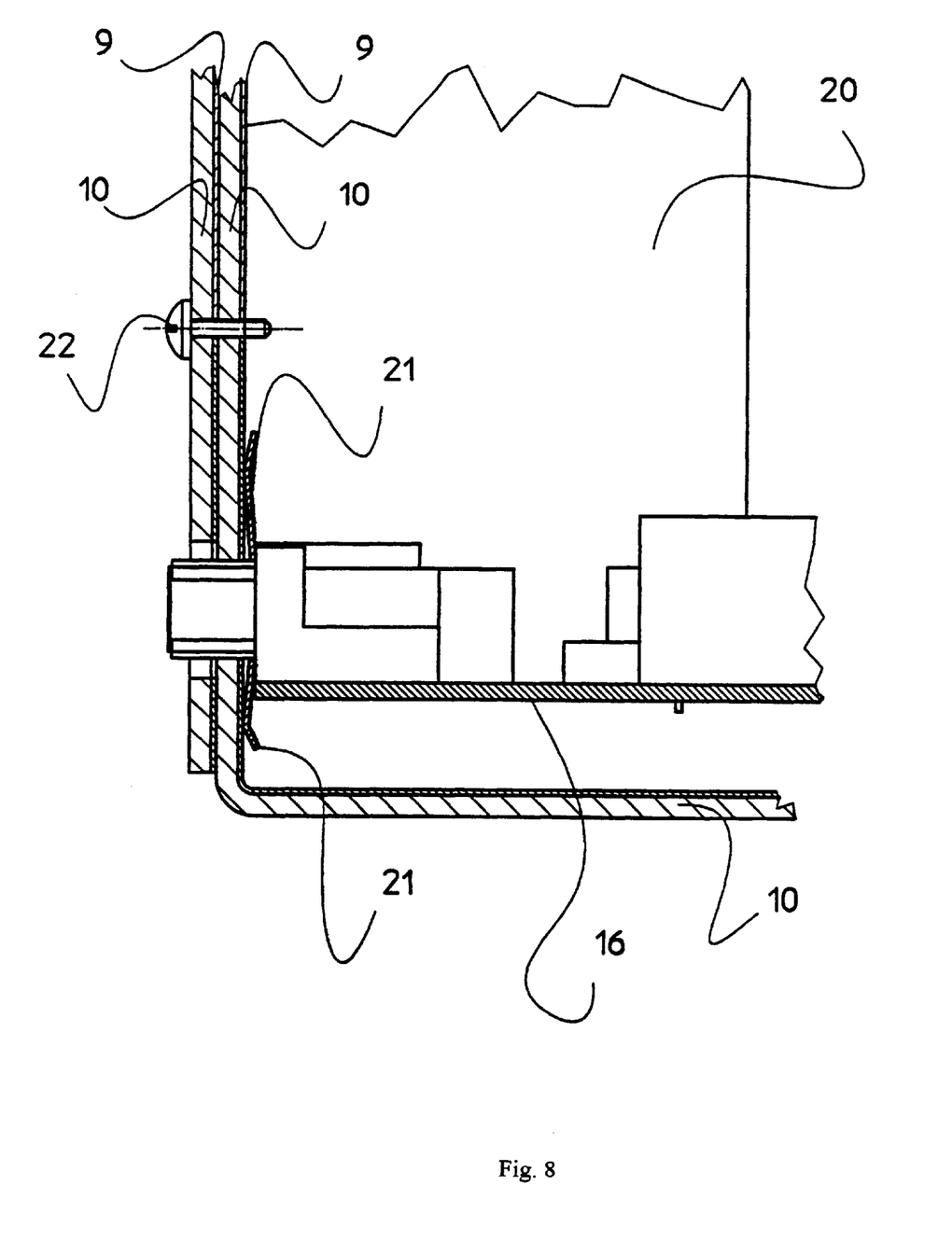
FIG. 8 provides an enlarged sectional view of the intersection of a printed circuit board with a side wall the inventive housing.

FIG. 8 provides an enlarged sectional view of the intersection of printed circuit board 16 with a side wall of housing 1. As shown, ground contact 21 of printed circuit board 16 contacts low impedance conducting layer 9 producing an electrical circuit between the two. Ground screw 22 intersects low impedance conducting layer 9 thereby providing an electrical connection to ground for conducting layer 9 and printed circuit board 16.

Figures 9A, 9B:
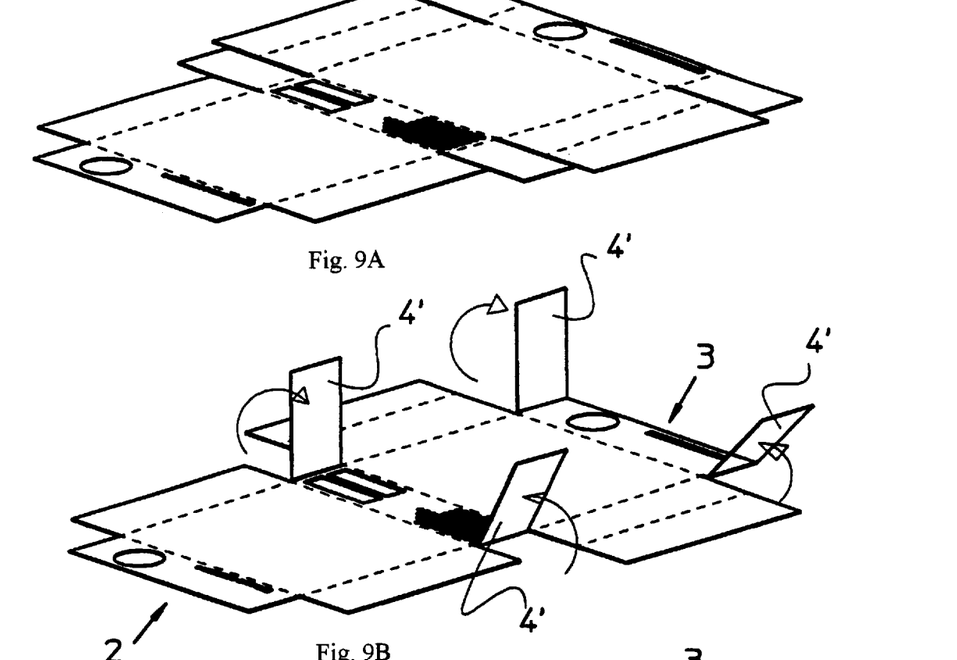
FIGS. 9A through 9H illustrate a sequence of folding a blank in accordance with the present invention to generate a housing.
Figure 9C:
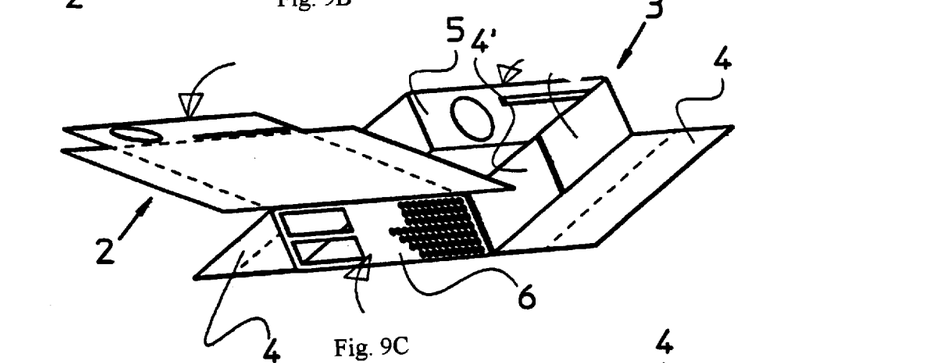
Figure 9D:
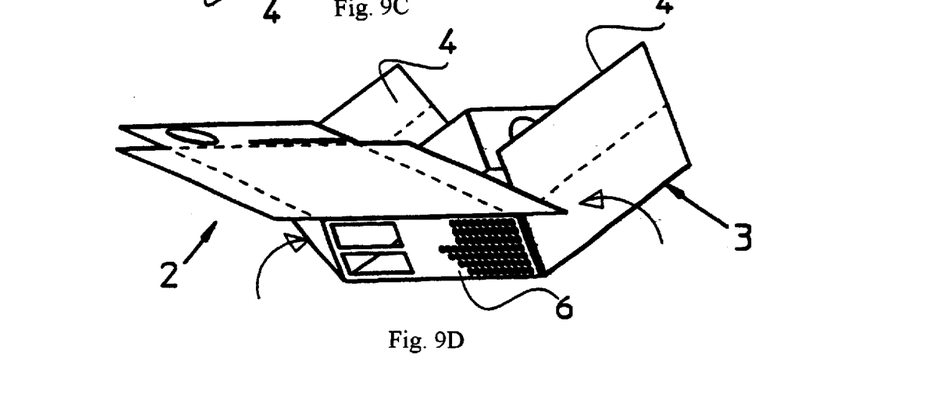
Figure 9E:
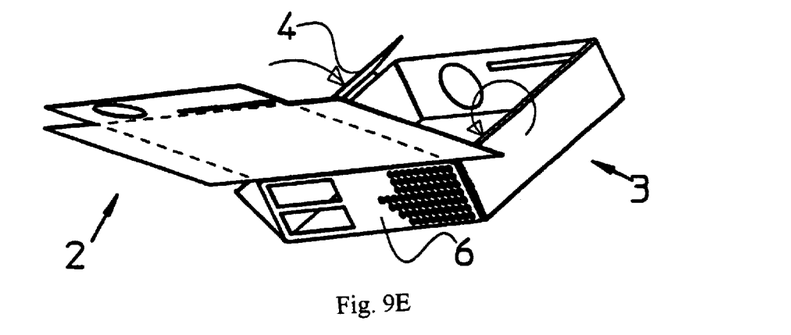

FIGS. 9A–H illustrate the sequence of folding operations needed to produce housing 1 from a beginning blank. FIG. 9A provides a view of the flat blank prior to its being folded. FIG. 9B illustrates the step of folding upward approximately 90 degrees relative to the base of top section 3 flaps or internal side panels 4' connected to back panel 5 of top section 3 and front panel 6. Thereafter, as shown in FIG. 9C, back panel 5 of top section 3 and front panel 6 are folded upward approximately 90 degrees relative to the base of the top section 3. Bottom section 2 is attached to front panel 6. As shown in FIG. 9D, side panels 4 of top section 3 are folded upwards approximately 90 degrees. Thereafter, as shown in FIG. 9E, the internal side panels 4' of top section 3 are folded downwards over internal side panels 4' which are connected to front panel 6 and back panel 5 of top section 3.

Figure 9F:
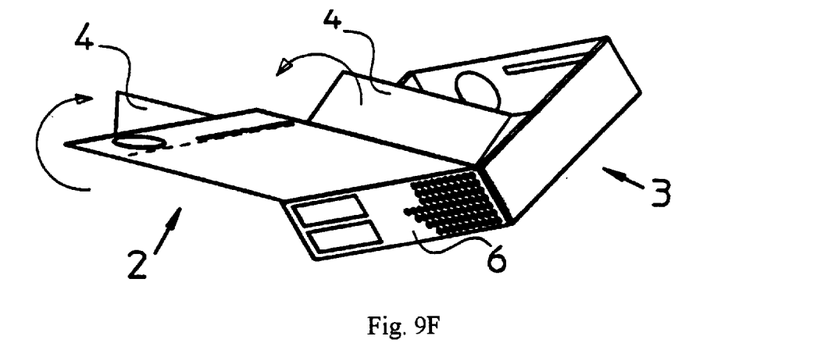
Figure 9G:
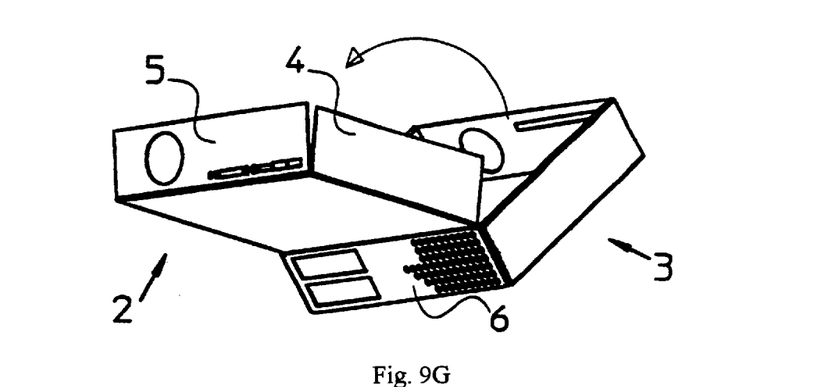
Figure 9H:
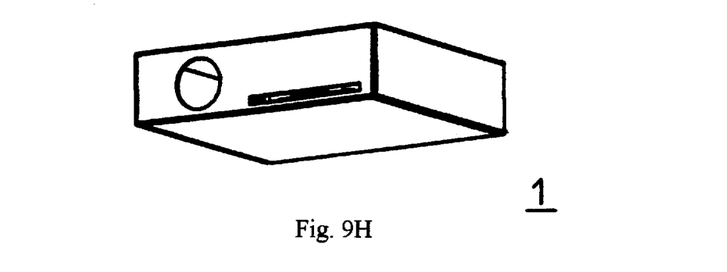

In FIG. 9F, side panels 4 of bottom section 2 and back panel 5 are folded upwards 90 degrees. It should be noted that side panels 4, front panel 5, and back panel 6 may be folded upwards either before or after the chassis has been fitted within housing 1, depending on production requirements or repair requirements. FIG. 9G illustrates that the housing is closed by rotating top section 3 over bottom section 2. FIG. 9H provides a perspective front view of the completed housing 1.

The present invention may be embodied in other specific forms without departing from the spirit or essential attributes thereof. For example, a chassis to be situated in housing 1 may comprise one, two, or more parts in which components may be housed. Also, the housing may be used to hold equipment other than electrical devices. Further, the shape and ratio of the various panels of the housing may vary from those described and shown. Accordingly, reference should be made to the appended claims as indicating the scope of the invention.

What is claimed is:

1. A foldable blank for forming a device housing, comprising:
   a top section having a top section base panel, a first top section side panel, a second top section side panel, and a top section back panel, wherein the first top section side panel, the second top section side panel, and the top section back panel are foldably connected to the top section base panel, the first and second top section side panels have internal side panels extending therefrom, and the top section back panel has a first and second internal side panel foldably attached thereto;
   a bottom section having a bottom section base panel, a first bottom section side panel, a second bottom section side panel, and a bottom section back panel, wherein the first bottom section side panel, second bottom section side panel, and bottom section back panel are foldably connected to the bottom section base panel; and
   a front panel foldably connected on one side with the top section base panel and foldably connected on a second side with the bottom section base panel, the front panel having an internal side panel extending from a third side and an internal side panel extending from a fourth side.

2. The foldable blank of claim 1 wherein said bottom section, top section, and front section are composed of a substrate having an electrically conductive layer situated thereon.

3. The foldable blank of claim 2 wherein said conductive layer substantially covers at least one surface of said substrate.

4. The foldable blank of claim 2 wherein said top section is foldable to form a top portion of a box and said bottom section is foldable to form a bottom portion of a box, said top portion hinging around said front section and over said bottom portion so as to form an enclosed box.

5. The foldable blank of claim 4 wherein said top portion has a first conducting projection situated therein electrically connected to said conducting layer and said bottom portion has a second conducting projection situated therein electrically connected to said conducting layer whereby when said top portion is placed substantially over said bottom portion, contact is established between said first conducting projection and said second conducting projection so as to establish electrical conductivity between said conducting layer in said top portion and said conducting layer in said bottom portion.

6. The foldable blank of claim 5 wherein said first conducting projection is attached to said top section internal side panels and said second conducting projection is attached to said bottom section side panels.

7. A method of constructing a housing from a foldable blank, wherein said foldable blank comprises:
   a top section having a top section base panel, a first top section side panel, a second top section side panel, and a top section back panel, wherein the first top section side panel, the second top section side panel, and the top section back panel are foldably connected to the top section base panel, the first and second top section side panels have internal side panels extending therefrom, and the top section back panel has a first and second internal side panel foldably attached thereto;

a bottom section having a bottom section base panel, a first bottom section side panel, a second bottom section side panel, and a bottom section back panel, wherein the first bottom section side panel, second bottom section side panel, and bottom section back panel are foldably connected to the bottom section base panel; and a front panel foldably connected on one side with the top section base panel and foldably connected on a second side with the bottom section base panel, the front panel having an internal side panel extending from a third side and an internal side panel extending from a fourth side, the top section, bottom section, and front panel being arranged flat relative to each other, said method comprising the following steps:

folding the internal side panels foldably connected to the top section back panel approximately ninety degrees relative to the top section back panel;

folding the internal side panels foldably connected to the front panel approximately ninety degrees relative to the front panel;

folding the top section back panel and the front panel approximately ninety degrees relative to the top section base panel;

folding the first and second top section side panels approximately ninety degrees relative to the top section base;

folding the top section internal side panels approximately ninety degrees relative to the top section side panels;

folding the bottom section side panels approximately ninety degrees relative to the bottom section base panel;

folding the bottom section back panel approximately ninety degrees relative to the bottom section base panel; and folding the base of the top section so as to become substantially parallel with the base of the bottom section.

* * * * *

UNITED STATES PATENT AND TRADEMARK OFFICE
CERTIFICATE OF CORRECTION

PATENT NO. : 6,288,329 B1
DATED : September 11, 2001
INVENTOR(S) : Kopp et al.

It is certified that error appears in the above-identified patent and that said Letters Patent is hereby corrected as shown below:

Column 6,
Line 4, "The sequence" should not begin a new paragraph;
Line 39, after the word "screws" please insert -- . --;

Column 7,
Line 16, please delete "View" and insert therefor -- view --;
Line 23, please delete "being" and insert therefor -- is --.

Signed and Sealed this

Thirtieth Day of April, 2002

Attest:

Attesting Officer

JAMES E. ROGAN
Director of the United States Patent and Trademark Office